United States Patent
Arakawa

(10) Patent No.: US 9,269,389 B2
(45) Date of Patent: Feb. 23, 2016

(54) SPUTTERING TARGET OF MAGNETIC MATERIAL

(75) Inventor: Atsutoshi Arakawa, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 740 days.

(21) Appl. No.: 13/513,387

(22) PCT Filed: Oct. 21, 2010

(86) PCT No.: PCT/JP2010/068552
§ 371 (c)(1),
(2), (4) Date: Jun. 1, 2012

(87) PCT Pub. No.: WO2011/070860
PCT Pub. Date: Jun. 16, 2011

(65) Prior Publication Data
US 2012/0241316 A1    Sep. 27, 2012

(30) Foreign Application Priority Data

Dec. 11, 2009    (JP) ................. 2009-281540

(51) Int. Cl.
| | |
|---|---|
| C23C 14/34 | (2006.01) |
| G11B 5/851 | (2006.01) |
| C22C 19/03 | (2006.01) |
| C22C 19/07 | (2006.01) |
| C22C 38/00 | (2006.01) |
| C22C 38/08 | (2006.01) |
| C22C 38/10 | (2006.01) |
| H01F 41/18 | (2006.01) |

(52) U.S. Cl.
CPC .............. *G11B 5/851* (2013.01); *C22C 19/03* (2013.01); *C22C 19/07* (2013.01); *C22C 38/002* (2013.01); *C22C 38/08* (2013.01); *C22C 38/10* (2013.01); *C22C 38/105* (2013.01); *C23C 14/3414* (2013.01); *H01F 41/183* (2013.01)

(58) Field of Classification Search
CPC . C23C 14/3414; H01J 37/3429; C22C 19/03; C22C 19/07; C22C 38/002; C22C 38/08; C22C 38/10; C22C 38/105; H01F 41/183; G11B 5/851
USPC .................................................... 204/298.13
See application file for complete search history.

(56) References Cited

U.S. PATENT DOCUMENTS

| | | |
|---|---|---|
| 5,282,946 A | 2/1994 | Kinoshita et al. |
| 5,538,565 A | 7/1996 | Akioka et al. |
| 6,398,880 B1 | 6/2002 | Bartholomeusz et al. |
| 6,406,600 B1 | 6/2002 | Takashima |
| 6,521,062 B1 | 2/2003 | Bartholomeusz et al. |
| 6,716,542 B2 | 4/2004 | Uwazumi et al. |
| 7,754,027 B2 | 7/2010 | Chen et al. |
| 7,909,949 B2 | 3/2011 | Nakamura et al. |
| 7,927,434 B2 * | 4/2011 | Nakamura et al. ............ 148/425 |
| 2002/0106297 A1 * | 8/2002 | Ueno et al. ...................... 419/12 |
| 2005/0011308 A1 * | 1/2005 | Ueno et al. ...................... 75/246 |
| 2005/0223848 A1 | 10/2005 | Ueno et al. |
| 2007/0209547 A1 | 9/2007 | Irumata et al. |
| 2008/0062575 A1 | 3/2008 | Shimizu |
| 2008/0105542 A1 | 5/2008 | Purdy et al. |
| 2008/0112841 A1 * | 5/2008 | Hayashi et al. ................. 420/79 |
| 2008/0173543 A1 | 7/2008 | Ziani |
| 2009/0242393 A1 | 10/2009 | Satoh |
| 2009/0308740 A1 | 12/2009 | Kato et al. |
| 2010/0089622 A1 | 4/2010 | Irumata et al. |
| 2010/0270146 A1 | 10/2010 | Nonaka et al. |
| 2010/0320084 A1 | 12/2010 | Sato |
| 2011/0114879 A1 | 5/2011 | Arakawa et al. |
| 2011/0132757 A1 | 6/2011 | Nakamura et al. |
| 2011/0162971 A1 | 7/2011 | Nakamura et al. |
| 2011/0247930 A1 | 10/2011 | Sato |
| 2011/0284373 A1 | 11/2011 | Sato et al. |
| 2012/0097535 A1 | 4/2012 | Ogino et al. |
| 2013/0206591 A1 | 8/2013 | Takami et al. |
| 2013/0341184 A1 | 12/2013 | Morishita et al. |

FOREIGN PATENT DOCUMENTS

| | | |
|---|---|---|
| JP | 2001-107226 A | 4/2001 |
| JP | 2001-181832 A | 7/2001 |

OTHER PUBLICATIONS

Translation of Sera (JP 2001-181832 cited on IDS) published Jul. 2001.*

* cited by examiner

*Primary Examiner* — John Brayton
(74) *Attorney, Agent, or Firm* — Howson & Howson LLP

(57) ABSTRACT

A magnetic sputtering target which contains B and is obtained by a melting and casting method, wherein the B content is 10 at % or more and 50 at % or less, and the remainder is one or more elements selected from Co, Fe, and Ni. Based on the method of the present invention, the sputtering target, in which gaseous impurities are few, there are no cracks and fractures, and segregation of its main constituent elements is minimal, is obtained. Consequently, when sputtered with a magnetron sputtering device comprising a DC power supply, this sputtering target yields a significant effect of being able to inhibit the generation of particles during sputtering, and improve the production yield upon forming thin films.

10 Claims, No Drawings

SPUTTERING TARGET OF MAGNETIC MATERIAL

BACKGROUND

The present invention relates to a sputtering target which contains boron (B) and is produced via the melting and casting method, and in particular relates to a target effective for use in a magnetic head, a magnetoresistive element (MRAM) or the like, in which gaseous impurities are few, compositional segregation is minimal, and there is no problem in mechanical properties such as cracks.

As the next-generation high-speed storage element, a magnetoresistive element (MRAM) is being developed, and a magnetic material containing boron (B) is being used as the material for use in layers configuring the MRAM. For example, known are compositions made from elements such as Co, Fe and Ni, and boron, even specifically Co—B or Co—Fe—B, or compositions in which Al, Cu, Mn, Ni and the like are added thereto.

Generally speaking, the magnetic layers configuring the MRAM are prepared by sputtering a target having a composition made of Co, Fe, Ni and the like and boron.

Since this kind of magnetic sputtering target comprises B as a main component, particularly if the composition ratio of B is increased and exceeds 10%, extremely fragile $Co_3B$, $Co_2B$, and CoB compound phases are formed. Consequently, the ingot becomes cracked or fractured, and it is difficult to obtain a sputtering target from the ingot.

When the ingot is prepared via slow cooling in order to prevent the foregoing problem, it is possible to inhibit the generation of cracks and fractures, but there is a problem in that compositional segregation will increase. Thus, targets have been obtained by subjecting powders to sintering and molding, but since the surface area of the powders is large and the adsorbed gas has trouble escaping, the amount of gaseous impurities, particularly oxygen, will increase. Consequently, there is a problem in that the characteristics of the film that is obtained via sputtering will be unstable.

Here, there are various types of sputtering devices, but a magnetron sputtering device comprising a DC power supply is widely used in the deposition of the foregoing magnetic film in light of its high productivity. The sputtering method is to place a target as the negative electrode opposite to a substrate as the positive electrode, and generate an electric field by applying a high voltage between the substrate and the target in an inert gas atmosphere.

Here, the inert gas is ionized to form plasma made of electrons and positive ions. When the positive ions in the plasma collide with the surface of the target (negative electrode), the atoms configuring the target are sputtered, and the sputtered atoms adhere to the opposing substrate surface and thereby form a film. This stands by the principle that the material configuring the target is deposited on the substrate as a result of this sequence of processes.

As described above, when using a sputtering target that is produced by sintering raw material powders, there is a significant drawback in that large amounts of oxygen are contained in comparison to the melted and casted material and that the density is low. The existence of large amounts of gas components such as oxygen generates particles during the sputtering of the target, and causes the magnetic properties of the magnetic film to be unstable. Accordingly, a method of adding B to a magnetic raw material for deoxidation has been proposed (refer to Patent Document 1).

Nevertheless, in the foregoing case, deoxidation is performed by adding B to an alloy mainly based on Co and melting the product, rapid solidification treatment and powderization are performed thereto, and sintering is further performed to the obtained powder in order to obtain a powder sintered target. In Patent Document 1, boron is added in an amount of 10% or less in order to eliminate oxygen from the raw metal such as Co, and this is to aim for deoxidation by adding B in a midway process. However, since the powder sintering method is ultimately adopted, as shown in the Examples and Comparative Examples of Patent Document 1, the results are inferior in terms of oxygen content and density in comparison to the melting and casting method, and it cannot be used for producing a target in which the composition of B needs to be controlled.

Normally, the oxygen content achieved by the powder sintering method is 150 wtppm or more. In order to further reduce the oxygen content, processes of the high costs need to be devised, and this is undesirable from the perspective of actual production.

[Patent Document 1] Japanese Laid-Open Patent Publication No. 2001-107226

SUMMARY OF INVENTION

An object of this invention is to produce a B and transition metal based sputtering target via the melting and casting method, improve the density, reduce compositional segregation, eliminate the generation of cracks and fractures, considerably reduce gas components such as oxygen, inhibit the degradation of quality of the formed film caused by the inclusion of gas components, and reduce the amount of particles that is generated during sputtering.

In order to achieve the foregoing object, as a result of intense study, the present inventors discovered that it is possible to produce a sputtering target by devising the melting and casting method, which has been conventionally considered difficult.

Based on the foregoing discovery, the present invention provides:

1) A sputtering target of magnetic material which contains B and is obtained by a melting and casting method, wherein the B content is 10 at % or more and 50 at % or less, the remainder is one or more elements selected from Co, Fe, and Ni, the oxygen content in the target is 100 wtppm or less, and the sputtering target is free from fractures and cracks.

2) Additionally provided is a target having a composition where one or more elements selected from Al, Cu, Mn, Nb, Ta, and Zr is added to the constituents in the foregoing target in an amount of 0.5 at % or more and 10 at % or less.

3) Additionally provided is the sputtering target of magnetic material according to 1) or 2) above which has superior uniformity in terms of the target component composition, wherein, when the composition of main constituent elements, particularly boron (B), within an arbitrary 1 mm square in the target is Am, (Am−A)/A, which is the deviation of Am from the composition A of the said constituent within the overall target, is 0.01 or less.

4) The present invention also provides a method of producing a sputtering target of magnetic material, wherein an ingot is prepared by melting and casting a raw material having a B content of 10 at % or more and 50 at % or less, and one or more elements selected from Co, Fe, and Ni as the remainder, and the ingot is cut and machined to obtain a target.

5) Additionally provided is the method of producing a sputtering target of magnetic material according to 4) above, wherein the ingot can be prepared by performing quenching at 30 to 60° C./minute after the melting process.

6) Additionally provided is the method of producing a sputtering target of magnetic material according to 5) above, wherein the quenched ingot can be further subject to heat treatment in a range of 800 to 1150° C.

7) Additionally provided is the method of producing a sputtering target of magnetic material according to 6) above, wherein the target can be obtained by cutting and machining the ingot after the heat treatment.

8) Additionally provided is the method of producing a sputtering target of magnetic material according to any one of 4) to 7) above, wherein the oxygen content in the target is 100 wtppm or less.

9) Additionally provided is the method of producing a sputtering target of magnetic material according to any one of 4) to 8) above, wherein the sputtering target contains one or more elements selected from Al, Cu, Mn, Nb, Ta, and Zr in an amount of 0.5 at % or more and 10 at % or less.

10) Additionally provided is the method of producing a sputtering target of magnetic material according to any one of 4) to 9) above, wherein, when the composition of main constituent elements, particularly boron (B), within an arbitrary 1 mm square in the target is Am, (Am−A)/A, which is the deviation of Am from the composition A of the said constituent within the overall target, is 0.01 or less.

The sputtering target of the present invention is produced from an ingot obtained through melting and casting, and yields superior effects of being able to obtain a high-density target, and considerably reduce the oxygen content in comparison to a conventional powder sintered target since it is a material that was subject to melting. Similarly, it is also possible to yield effects of being able to reduce the gas components, and inhibit the non-uniformity structure and the generation of particles caused by gas components such as oxygen.

DETAILED DESCRIPTION

As the components configuring the sputtering target of the present invention, the B content is 10 at % or more and 50 at % or less, and the remainder is one or more elements selected from Co, Fe, and Ni. As described above, it is also possible to add one or more elements selected from Al, Cu, Mn, Nb, Ta, and Zr in an amount of 0.5 at % or more and 10 at % or less. These are elements that are added as needed in order to improve the magnetoresistive-element characteristics.

The reason why the B content is 10 at % or more is as follows. If the B content is less than 10 at %, production is relatively easy, the compositional segregation will be low, and the generation of cracks and fractures cannot be observed. However, it is not possible to obtain the intended characteristics for use in a magnetic head or MRAM. Normally, the B content is desirably 15 at % or more in order to utilize the characteristics for use in a magnetic head or MRAM, but in terms of production, even the B content of 10 at % or more, which has previously been difficult to realize, demonstrates its effects on preventing cracks and fractures and eliminating compositional segregation. Thus, the lower limit of the B content is set to at least 10 at %.

Moreover, the upper limit of the B content is set at 50 at %, and the reason for this is because, if the B content exceeds 50 at %, the melting point becomes high and it will not be possible to melt the raw material. Accordingly, the upper limit of the B content is set to 50 at %. Furthermore, the B content is normally 35 at % or less in a magnetic head or MRAM, and there is hardly any case where the B content needs to exceed 35 at %.

After blending these raw materials, they are melted and casted to prepare an ingot, and the ingot is cut and machined to obtain a target. The machining process naturally includes the adjustment of the target shape and the polishing of the target surface so that the target can sufficiently exert its functions in a sputtering device.

The blending ratio of the foregoing components will differ depending on the alloy component, but they can all maintain the magnetic-head or MRAM characteristics. Moreover, this technology is effective since the foregoing characteristics can be maintained for usages other than a magnetic head or MRAM; for instance, for use to form a standard magnetic film having the foregoing compositional range.

Moreover, the melting conditions such as the melting temperature will naturally differ depending on the alloy type and blending ratio, but melting is performed within a range of approximately 1100 to 1500° C.

In the present invention, after the foregoing melting process, the melt is poured from a crucible into a casting mold. The casting mold containing an ingot under solidification is rapidly cooled at a rate of 30 to 60° C./minute. The obtained ingot can be used to produce a magnetic sputtering target. This is an effective method for inhibiting component segregation. Generally speaking, slow cooling in the furnace is recommended in order to inhibit the ingot from cracking, but this causes compositional segregation and is undesirable. Accordingly, the foregoing rapid cooling is a preferred method in the present invention. It is thereby possible to obtain a target wherein, when the composition of main constituent elements, particularly boron (B), within an arbitrary 1 mm square in the target is Am, (Am−A)/A, which is the deviation of Am from the composition A of the said constituent within the overall target, is 0.01 or less.

Moreover, when producing a target based on this kind of melting method, the oxygen concentration can be reduced to 100 wtppm or less. Moreover, the oxygen concentration can be further reduced to 50 wtppm or less, and even 10 wtppm or less.

Moreover, nitrogen as a gas component to become an impurity can be reduced to 10 wtppm or less, and carbon can be reduced to 200 wtppm or less.

Moreover, the rapidly cooled ingot can be further subject to heat treatment in a range of 800 to 1100° C. when the B content is 30 at % or less, or in a range of 850 to 1150° C. when the B content exceeds 30 at %. This heat treatment temperature can, of course, be changed depending on the alloy type and blending ratio, and can be suitably selected within the foregoing temperature range. Based on this heat treatment, an effect is yielded in that the strain of the "as-cast" structure can be eliminated to achieve a uniform structure. Moreover, this heat treatment also yields an effect of being able to inhibit the target from cracking. In order to suppress crack formation in the ingot, the heat treatment is desirably applied as soon as possible after the ingot is made. It is enough for heat treatment to be performed for 2 hours or longer depending on the size of the ingot to be treated, and there is no problem if the heat treatment is performed for a long period. However, from the perspective of cost, there is no need to perform the heat treatment for longer than 20 hours. As described above, the casting is ordinarily cooled at a rate of 30 to 60° C./minute, but if cooling is performed up to a temperature that is close to room temperature, there are cases where the ingot will crack due to the strain caused by the temperature difference between the surface and inside of the ingot. In order to prevent the ingot from cracking, the measure of performing heat treatment midway during the cooling of the ingot is effective.

Rolling treatment can be further performed after the foregoing heat treatment. It is thereby possible to destroy the cast structure and maintain the structural uniformity. It is also possible to perform heat treatment once again after the foregoing rolling treatment in order to obtain a recrystallized structure. After the foregoing treatments, the ingot is cut and machined to obtain a target. Since processing becomes difficult if the B content is increased, a cast target is desirably used. If the ingot is cut after it is subject to heat treatment, the problem of cracks will not arise.

EXAMPLES

The present invention is now explained based on the Examples and the Comparative Examples. Note that these Examples are illustrative only, and the present invention shall not be limited to these Examples in any way. In other words, this invention is limited only by the scope of claims, and covers the various modifications other than the Examples contained in the present invention.

Example 1

Co, Fe, and B were used as the raw materials, and blended to achieve 60 at % of Co, 20 at % of Fe, and 20 at % of B. Subsequently, the raw materials were placed in a crucible and melted by being heated at 1180° C. This was casted to obtain an ingot, the obtained ingot was rapidly cooled at a rate of 50° C./minute, heat treatment was performed at 1000° C. for 5 hours midway during the rapid cooling process, and the ingot was thereafter cooled at a rate of 50° C./minute. Subsequently, the ingot was cut with a lathe to obtain a target having a diameter of 164.0 mm and a thickness of 4.0 mm. The analytical values of impurities in this target are shown in Table 1. The foregoing Example explained a case of using 60 at % of Co, 20 at % of Fe, and 20 at % of B, but similar results were obtained in all cases where the B content was 10 at % or more and 50 at % or less, and the remainder is one or more elements selected from Co, Fe, and Ni.

TABLE 1

| | Al | Cu | Ni | Si | C | O | (wtppm) N |
|---|---|---|---|---|---|---|---|
| Example 1 | <10 | 10 | 90 | 44 | 150 | <10 | <10 |
| Comparative Example 1 | <10 | 20 | 110 | 77 | 160 | 180 | <10 |
| Example 2 | — | <10 | 86 | 40 | 160 | 20 | <10 |
| Example 3 | <10 | — | 92 | 38 | 150 | 10 | <10 |
| Example 4 | <10 | <10 | 80 | 45 | 160 | 20 | <10 |
| Example 5 | <10 | 15 | 82 | 48 | 140 | <10 | <10 |
| Example 6 | <10 | 24 | 77 | 50 | 150 | 10 | <10 |
| Example 7 | <10 | 23 | 72 | 46 | 160 | 30 | <10 |

As shown in Table 1, Al was less than 10 wtppm, Cu was 10 wtppm, Ni was 90 wtppm, Si was 44 wtppm, C was 150 wtppm, O was less than 10 wtppm, and N was less than 10 wtppm.

The density of the target of Example 1 was 7.83 g/cm$^3$. Furthermore, as magnetic properties, the saturated magnetization 4 πIs (G) was 15170, and the maximum permeability μmax was 25.7.

When the composition of main constituent elements, particularly boron (B), within an arbitrary 1 mm square in the target is Am; (Am−A)/A is an index showing the compositional variation in the target and is the deviation of Am from the composition A of the said constituent within the overall target. As to the target of Example 1, the boron composition was within a range between 19.8 at % and 20.2 at % relative to 20 at % of the overall composition. Even in the portion with the most deviated composition, (Am−A)/A was 0.01, and at all arbitrary points in the target, (Am−A)/A was 0.01 or less.

Comparative Example 1

The raw materials were atomized to obtain an alloy powder having an average grain size of 150 μm containing 60 at % of Co, 20 at % of Fe, and 20 at % of B. This alloy powder was sintered at 1050° C., and the obtained ingot was cut with a lathe to obtain a target having a diameter of 165.1 mm and a thickness of 6.35 mm. The analytical values of impurities in this target are also shown in Table 1.

As shown in Table 1, Al was less than 10 wtppm, Cu was 20 wtppm, Ni was 110 wtppm, Si was 77 wtppm, C was 160 wtppm, O was 180 wtppm, and N was less than 10 wtppm.

Moreover, the target density was 7.73 g/cm$^3$. Furthermore, as magnetic properties, the saturated magnetization 4 πIs (G) was 14780, and the maximum permeability μmax was 24.7.

When the composition of main constituent elements, particularly boron (B), within an arbitrary 1 mm square in the target is Am; (Am−A)/A, which is an index showing the compositional variation in the target and is the deviation of Am from the composition A of the said constituent within the overall target, was 0.01 or less in the target of Comparative Example 1.

(Comparison of Targets Between Example 1 and Comparative Example 1)

As shown in Table 1, most of the impurities have been reduced in Example 1 in comparison to Comparative Example 1. In particular, the reduction of oxygen was considerable. Meanwhile, even though an atomized powder was used in Comparative Example 1, the oxygen content was 180 wtppm, and there is a problem in that gas components will increase in a target.

With respect to the target density, Example 1 had a higher density in comparison to Comparative Example 1, and this is an inevitable result. A low density means the presence of holes, and such holes facilitate the generation of arcing and the generation of particles.

Accordingly, the improvement of density functions to inhibit the generation of arcing and the generation of particles. Example 1 is effective also with respect to this point.

They were roughly equal in saturated magnetization 4 πIs (G) and maximum permeability μmax as magnetic properties. Comparison of characteristics other than the analytical value of impurities between Example 1 and Comparative Example 1 is shown in Table 2.

TABLE 2

| | Density | Saturated magnetization: 4πIs (G) | Maximum permeability: μmax | (Am − A)/A |
|---|---|---|---|---|
| Example 1 | 7.83 | 15170 | 25.7 | ≤0.01 |
| Comparative Example 1 | 7.73 | 14780 | 24.7 | ≤0.01 |

(Am − A)/A: When the composition of boron (B) is Am, this shows the deviation of Am from the composition A of the said component within the overall target.
4πIs (G), μmax: They both indicate the magnetic property.

Comparative Example 2

Co, Fe, and B were used as the raw materials, and blended to achieve 60 at % of Co, 20 at % of Fe, and 20 at % of B. Subsequently, the raw materials were placed in a crucible and melted by being heated at 1180° C. This was casted to obtain an ingot, the obtained ingot was cooled at 20° C./minute to room temperature, but heat treatment was not performed. As a result of setting the cooling rate from 1180° C. at 20° C./minute, the index (Am−A)/A showing the compositional variation in the target was great at 0.03.

Comparative Example 3

Co, Fe, and B were used as the raw materials, and blended to achieve 60 at % of Co, 20 at % of Fe, and 20 at % of B. Subsequently, the raw materials were placed in a crucible and melted by being heated at 1180° C. This was casted to obtain an ingot. Here, the obtained ingot was quenched from 1180° C. to room temperature at a cooling rate of 40° C./minute, but heat treatment was not performed. The obtained ingot had cracked.

Example 2 to Example 7

The basic constituents were Co, 20 at % of Fe, and 20 at % of B. Added thereto were, respectively, 0.5 at % of Al in Example 2, 1 at % of Cu in Example 3, 2 at % of Mn in Example 4, 5 at % of Nb in Example 5, 7 at % of Ta in Example 6, and 10 at % of Zr in Example 7, and the components were adjusted so that the remainder will be Co. Subsequently, these were respectively placed in a crucible and melted by being heated at 1180° C. In addition, each of these was casted to obtain an ingot. The ingots were rapidly cooled at a rate of 30 to 60° C./minute, heat treatment was performed at 900 to 1100° C. for 2 to 20 hours midway during the rapid cooling process, and these were thereafter cooled at a rate of 30 to 60° C./minute. Subsequently, the respective ingots were cut with a lathe to obtain a target having a diameter of 164.0 mm and a thickness of 4.0 mm. The analysis of impurities in these targets is shown in Table 1.

(Impurity Analysis of Example 2)

As shown in Table 1, in Example 2, Cu was less than 10 wtppm, Ni was 86 wtppm, Si was 40 wtppm, C was 160 wtppm, O was 20 wtppm, and N was less than 10 wtppm. Note that, since Al is added in Example 2, it is not counted as an impurity.

As shown in Table 1, most of the impurities have been reduced in Example 2 in comparison to Comparative Example 1. In particular, the considerable reduction of oxygen was confirmed.

(Impurity Analysis of Example 3)

As shown in Table 1, in Example 3, Al was less than 10 wtppm, Ni was 92 wtppm, Si was 38 wtppm, C was 150 wtppm, O was 10 wtppm, and N was less than 10 wtppm. Note that, since Cu is added in Example 3, it is not counted as an impurity.

As shown in Table 1, most of the impurities have been reduced in Example 3 in comparison to Comparative Example 1. In particular, the considerable reduction of oxygen was confirmed.

(Impurity Analysis of Example 4)

As shown in Table 1, in Example 4, Al was less than 10 wtppm, Cu was less than 10 wtppm, Ni was 80 wtppm, Si was 45 wtppm, C was 160 wtppm, O was 20 wtppm, and N was less than 10 wtppm. As shown in Table 1, most of the impurities have been reduced in Example 4 in comparison to Comparative Example 1. In particular, the considerable reduction of oxygen was confirmed.

(Impurity Analysis of Example 5)

As shown in Table 1, in Example 5, Al was less than 10 wtppm, Cu was 15 wtppm, Ni was 82 wtppm, Si was 48 wtppm, C was 140 wtppm, O was less than 10 wtppm, and N was less than 10 wtppm. As shown in Table 1, most of the impurities have been reduced in Example 5 in comparison to Comparative Example 1. In particular, the considerable reduction of oxygen was confirmed.

(Impurity Analysis of Example 6)

As shown in Table 1, in Example 6, Al was less than 10 wtppm, Cu was 24 wtppm, Ni was 77 wtppm, Si was 50 wtppm, C was 150 wtppm, O was 10 wtppm, and N was less than 10 wtppm. As shown in Table 1, most of the impurities have been reduced in Example 6 in comparison to Comparative Example 1. In particular, the considerable reduction of oxygen was confirmed.

(Impurity Analysis of Example 7)

As shown in Table 1, in Example 7, Al was less than 10 wtppm, Cu was 23 wtppm, Ni was 72 wtppm, Si was 46 wtppm, C was 160 wtppm, O was 30 wtppm, and N was less than 10 wtppm. As shown in Table 1, most of the impurities have been reduced in Example 7 in comparison to Comparative Example 1. In particular, the considerable reduction of oxygen was confirmed.

As described above, the results that were basically the same as Example 1 could be obtained in Example 2 to Example 7. It was confirmed that the addition of one or more elements selected from Al, Cu, Mn, Nb, Ta, and Zr in an amount of 0.5 at % or more and 10 at % or less does not affect the impurities. Moreover, the same results were obtained even with the combined addition of the foregoing elements.

The addition of one or more elements selected from Al, Cu, Mn, Nb, Ta, and Zr in an amount of 0.5 at % or more and 10 at % or less shown in Example 2 to Example 7 results in a slight variation of the density and the magnetic properties (4 πIs (G), μmax), but the change was not significant in comparison to Example 1. Moreover, in all cases, when the composition of boron (B) is Am; (Am−A)/A, which is the deviation of Am from the composition A of the said constituent within the overall target, was 0.01 or less. Favorable targets could be obtained.

The sputtering target of the present invention is produced from an ingot obtained through melting and casting, and yields superior effects of being able to obtain a high-density target, and considerably reduce the oxygen content in comparison to a conventional powder sintered target since it is a material that was subject to melting.

Similarly, the sputtering target of the present invention is also possible to yield effects of being able to reduce the gas components, and inhibit the non-uniformity structure and the generation of particles caused by gas components such as oxygen. In particular, the sputtering target of the present invention is useful as a sputtering target for use in MRAM, a magnetic head, or other magnetic films.

The invention claimed is:

1. A sputtering target of a magnetic material, having a cast structure obtained by melting and succeeding casting, wherein the sputtering target has a composition consisting of B in an amount of 10 at % or more and 50 at % or less, one or more elements selected from the group consisting of Co, Fe, and Ni, and impurity oxygen in an amount of 100 wtppm or less, and wherein the sputtering target has a location to location variation of B content defined as (Am−A)/A in an amount of 0.01 or less within the sputtering target, where A is a content of B of the sputtering target as a whole and Am is a content of B analyzed for an arbitrarily selected location having an area of 1 mm square within the target.

2. A sputtering target of a magnetic material, having a cast structure obtained by melting and succeeding casting, wherein the sputtering target has a composition consisting of B in an amount of 10 at % or more and 50 at % or less, one or more elements selected from the group consisting of Al, Cu, Mn, Nb, Ta, and Zr in an amount of 0.5 at % or more and 10 at % or less, one or more elements selected from the group consisting of Co, Fe, and Ni, and impurity oxygen in an amount of 100 wtppm or less, and wherein the sputtering target has a location to location variation of B content defined as (Am−A)/A in an amount of 0.01 or less within the sputtering target, where A is a content of B of the sputtering target as a whole and Am is a content of B analyzed for an arbitrarily selected location having an area of 1 mm square within the target.

3. A method of producing a sputtering target of a magnetic material having a cast structure, comprising the steps of: preparing an ingot by melting and casting a raw material having a composition consisting of B in an amount of 10 at % or more and 50 at % or less, one or more elements selected from the group consisting of Co, Fe, and Ni, and impurity oxygen in an amount of 100 wtppm or less; and cutting and machining the ingot to obtain a target, wherein the sputtering target has a location to location variation of B content defined as (Am−A)/A in an amount of 0.01 or less within the sputtering target, where A is a content of B of the sputtering target as a whole and Am is a content of B analyzed for an arbitrarily selected location having an area of 1 mm square within the target.

4. The method of producing a sputtering target of magnetic material according to claim 3, wherein the ingot is prepared by performing rapid cooling at a rate of 30 to 60° C./minute after the melting process.

5. The method of producing a sputtering target of magnetic material according to claim 4, wherein the rapidly cooled ingot is further subject to heat treatment in a range of 800 to 1100° C. when the B content is 30 at % or less, or in a range of 850 to 1150° C. when the B content exceeds 30 at %.

6. The method of producing a sputtering target of magnetic material according to claim 5, wherein the target is obtained by cutting and machining the ingot after the heat treatment.

7. A method of producing a sputtering target of a magnetic material having a cast structure, comprising the steps of: preparing an ingot by melting and casting a raw material having a composition consisting of B in an amount of 10 at % or more and 50 at % or less, one or more elements selected from Al, Cu, Mn, Nb, Ta, and Zr in an amount of 0.5 at % or more and 10 at % or less, one or more elements selected from the group consisting of Co, Fe, and Ni, and impurity oxygen in an amount of 100 wtppm or less; and cutting and machining the ingot to obtain a target, wherein the sputtering target has a location to location variation of B content defined as (Am−A)/A in an amount of 0.01 or less within the sputtering target, where A is a content of B of the sputtering target as a whole and Am is a content of B analyzed for an arbitrarily selected location having an area of 1 mm square within the target.

8. The method of producing a sputtering target of magnetic material according to claim 7, wherein the ingot is prepared by performing rapid cooling at a rate of 30 to 60° C./minute after the melting process.

9. The method of producing a sputtering target of magnetic material according to claim 8, wherein the rapidly cooled ingot is further subject to heat treatment in a range of 800 to 1100° C. when the B content is 30 at % or less, or in a range of 850 to 1150° C. when the B content exceeds 30 at %.

10. The method of producing a sputtering target of magnetic material according to claim 9, wherein the target is obtained by cutting and machining the ingot after the heat treatment.

* * * * *